United States Patent
Choi et al.

(10) Patent No.: US 7,067,420 B2
(45) Date of Patent: Jun. 27, 2006

(54) METHODS FOR FORMING A METAL LAYER ON A SEMICONDUCTOR

(75) Inventors: Kyung-In Choi, Gyeonggi-do (KR); Gil-Heyun Choi, Gyeonggi-do (KR); Byung-Hee Kim, Seoul (KR); Sang-Bum Kang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 279 days.

(21) Appl. No.: 10/404,360

(22) Filed: Apr. 1, 2003

(65) Prior Publication Data
US 2003/0219979 A1     Nov. 27, 2003

(30) Foreign Application Priority Data
May 21, 2002   (KR)   ............. 10-2002-0028201

(51) Int. Cl.
H10L 21/4763   (2006.01)
H10L 21/20     (2006.01)
H10L 21/44     (2006.01)

(52) U.S. Cl. ............ 438/648; 438/584; 438/679; 438/685

(58) Field of Classification Search ........... 438/648, 438/679, 685, 584
See application file for complete search history.

(56) References Cited

U.S. PATENT DOCUMENTS

| | | | |
|---|---|---|---|
| 5,668,054 A | 9/1997 | Sun et al. | 438/653 |
| 6,153,519 A | 11/2000 | Jain et al. | 438/681 |
| 6,204,204 B1 | 3/2001 | Paranjpe et al. | 438/785 |
| 6,727,592 B1* | 4/2004 | Woo et al. | 257/762 |
| 2003/0057526 A1* | 3/2003 | Chung et al. | 257/642 |

FOREIGN PATENT DOCUMENTS

| | | |
|---|---|---|
| JP | 2001230217 | 8/2001 |
| KR | 10-0282927 | 9/2000 |

OTHER PUBLICATIONS

Notice to Submit Response for corresponding Korean Application No. 10-2002-0028201 dated Sep. 23, 2004 (English Translation).

Jin-Seong Park et al., "Plasma-Enhanced Atomic Layer Deposition of Tantalum Nitrides Using Hydrogen Radicals as a Reducing Agent", Electrochemical and Solid State Letters, 4 (4) C17-C19 (2001).

* cited by examiner

Primary Examiner—Chuong A. Luu
(74) Attorney, Agent, or Firm—Myers Bigel Sibley & Sajovec

(57) ABSTRACT

A metal layer is formed on an integrated circuit device including forming an insulating layer on an integrated circuit substrate. A contact hole is formed by selectively etching the insulating layer to thereby partially expose the substrate. A metal layer including tantalum nitride is formed on the insulating layer including the contact hole using a tantalum precursor including a tantalum element and at least one bonding element that is chemically bonded to the tantalum element. A part of the at least one bonding element include at least one ligand bonding element that is ligand-bonded to the tantalum element. Forming the metal layer may include removing at least some of the ligand bonded elements with a removing gas that is substantially free of hydrogen radicals. The metal layer may be formed using a chemical vapor deposition (CVD) or an atomic layer deposition (ALD) process. A copper or other metal layer may be deposited on the metal layer including tantalum nitride.

27 Claims, 13 Drawing Sheets

METHODS FOR FORMING A METAL LAYER ON A SEMICONDUCTOR

RELATED APPLICATION

This application claims priority to Korean Patent Application 2002-28201, filed on May 21, 2002, the contents of which are herein incorporated by reference in their entirety.

BACKGROUND OF THE INVENTION

The present invention relates to methods and apparatus for forming metal layers on an integrated circuit (semiconductor) device, and more particularly, to forming a layer including tantalum.

Various integrated circuit (semiconductor) devices, such as memory devices, are designed to operate at high speeds and/or have large storage capacity. To provide increased speed or capacity in such devices, various semiconductor technologies have been developed directed to improving the integration density, reliability and/or speed of the semiconductor devices.

There are typically strict requirements for metal layers that are used for metal lines on such a semiconductor device. Furthermore, to increase the density of devices formed on a semiconductor substrate, the metal layer is generally formed as a multi-layer structure. The metal layer is generally formed by depositing aluminum or tungsten. However, the specific resistance of aluminum is typically about $2.8 \times 10^{-8}$ $\Omega$m (ohm-meters) and the specific resistance of tungsten is about $5.5 \times 10^{-8}$ $\Omega$m, so they are typically not desirable as a multi-layer structure. Accordingly, copper, which has relatively low specific resistance and good electro-migration characteristics, may be used as a metal layer.

Copper generally has a high mobility in silicon and silicon dioxide ($SiO_2$). In addition, when copper is reacted with silicon and silicon dioxide, the copper may be easily oxidized. Therefore, it is known to suppress the oxidization of copper using a barrier metal layer. A titanium nitride layer is widely used as the barrier metal layer. However, the titanium nitride layer is generally not suitable as a barrier metal layer for copper because the titanium nitride layer may be required to have a thickness above 30 nm to restrain the mobility of the copper. Because the titanium nitride layer has a resistance proportional to the thickness thereof and high reactivity, the resistance is generally significantly increased when the titanium nitride layer has a thickness above 30 nm.

Therefore, it is known to use a tantalum nitride layer for the barrier metal layer. A tantalum nitride layer may restrain the mobility of the copper even when the tantalum nitride layer is thin and has low resistance. The tantalum nitride layer may also be suitable for metal plugs and metal wires for good step coverage and gap-fill degree thereof. Examples of tantalum nitride layers that can be used as barrier metal layers are disclosed in U.S. Pat. No. 6,204,204 (issued to Paranjpe et. al.), U.S. Pat. No. 6,153,519 (issued to Jain et. al.), and U.S. Pat. No. 5,668,054 (issued to Sun et. al.).

As described in U.S. Pat. No. 5,668,054, the tantalum nitride layer is deposited through a chemical vapor deposition (CVD) process using terbutylimido-tris-diethylamido-tantalum (($NEt_2$)$_3$Ta=Nbut (hereinafter referred to as "TBTDET") as a reactant. The process is carried out at a temperature above 600° C. as the specific resistance of the tantalum nitride layer may exceed 10,000 $\mu\Omega$cm when the process is carried out at a temperature of about 500° C. In addition, as the process is carried out at a relatively high temperature, the semiconductor device can be thermally damaged. It is also generally difficult to achieve a tantalum nitride layer having superior step coverage using a CVD process.

An atomic layer deposition (ALD) process has been suggested as an alternative to the chemical vapor deposition process. The atomic layer deposition process can be carried out at a relatively low temperature as compared with a conventional thin film forming process and can achieve superior step coverage. Examples of ALD processes for depositing tantalum nitride are disclosed in U.S. Pat. No. 6,203,613 (issued to Gates) and in an article by Kang et al., entitled "Plasma-Enhanced Atomic Layer Deposition of Tantalum Nitrides Using Hydrogen Radicals as a Reducing Agent," Electrochemical and Solid-State Letters, 4(4) C17–19 (2001). As described in the Kang et al. article, a tantalum nitride layer having a specific resistance about 400 $\mu\Omega$cm can be formed by the ALD process using TBTDET. The deposition is carried out at a temperature of about 260° C. Accordingly, a tantalum nitride layer having a low specific resistance may be formed at a relatively low temperature.

However, a hydrogen radical obtained by a plasma-enhanced process is used as a reducing agent in the Kang et al. process. Accordingly, a power source is applied to the chamber during deposition. For this reason, the process described by Kang et al. has process parameters that may be influenced by the power source applied to the chamber. Thus, while the Kang et al. process describes forming a thin film at a relatively low temperature, the process includes controlling additional process parameters, such as the power source. Moreover, because the Kang et al. process includes applying the power source directly to a predetermined portion of the chamber in which a semiconductor substrate is placed, the semiconductor substrate can be damaged by the power source.

SUMMARY OF THE INVENTION

In some embodiments of the present invention, a method of forming a metal layer on an integrated circuit device includes forming an insulating layer on an integrated circuit substrate. A contact hole is formed by selectively etching the insulating layer to thereby partially expose the substrate. A metal layer including tantalum nitride is formed on the insulating layer including the contact hole using a tantalum precursor including a tantalum element and bonding element(s) that are chemically bonded to the tantalum element. A part of the bonding element(s) includes at least one ligand bonding element that is ligand-bonded to the tantalum element. Forming the metal layer may include removing at least some of the ligand bonded elements with a removing gas that is substantially free of hydrogen radicals. The metal layer may be formed using a chemical vapor deposition (CVD) or an atomic layer deposition (ALD) process. A copper or other metal layer may be deposited on the metal layer including tantalum nitride.

In some embodiments of the present invention, the removing gas is activated through a remote plasma process. The tantalum precursor may include a tantalum amine derivative and/or a tantalum halide derivative. The tantalum amine derivative may include $Ta(NR_1)(NR_2R_3)_3$, $Ta(NR_1R_2)_5$, $Ta(NR_1R_2)_x(NR_3R_4)_{5-x}$ and/or terbutylimido-tris-diethylamido tantalum (TBTDET:$(Net_2)_3$Ta=NBu$^t$), wherein, $R_1$, $R_2$, $R_3$ and $R_4$ are independently selected from the group consisting of H and $C_1$–$C_6$ alkyl radicals, and x is 1, 2, 3 or 4. The tantalum precursor may include a tantalum halide derivative that includes $TaF_5$, $TaCl_5$, $TaBr_5$ and/or $TaI_5$.

In other embodiments of the present invention, the tantalum precursor is introduced in a gaseous state. The metal layer may be formed at a temperature in a range from about 100° C. to about 650° C. and at a pressure in a range from about 0.3 Torr to about 30 Torr.

In further embodiments of the present invention, forming the metal layer includes introducing the tantalum precursor and chemisorbing at least part of the tantalum precursor on the insulating layer including the contact hole. A non-chemisorbed tantalum precursor that has not been chemisorbed to the insulating layer is removed. The ligand bonded element of the bonding elements of the chemisorbed tantalum precursor is removed from the chemisorbed tantalum precursor using the removing gas. A residual material around the integrated circuit substrate is removed when removing the ligand bonded element. A thin film including tantalum nitride is formed on the insulating layer including the contact hole by repeating various of the operations described above a plurality of times.

An inert gas may be used to remove non-chemisorbed tantalum precursor. The removing gas for the ligand bonded element may be selected from the group consisting of $H_2$, $NH_3$, $SiH_4$, $Si_2H_6$ and combinations thereof or from the group consisting of $NH_3$, $SiH_4$, $Si_2H_6$ and combinations thereof. The gas may be activated through a remote plasma process and/or a direct plasma process. The method may further include following formation of the metal layer by a post treatment process for the thin film using a gas selected from the group consisting of $H_2$, $NH_3$, $SiH_4$, $Si_2H_6$, and combinations thereof activated through a remote plasma process and/or a direct plasma process.

In other embodiments of the present invention, methods of forming a metal layer on an integrated circuit device include forming an insulating layer on an integrated circuit substrate. A contact hole is formed by selectively etching the insulating layer to thereby partially expose the substrate. A metal layer including tantalum nitride is formed on the insulating layer including the contact hole using a tantalum precursor including a tantalum element and bonding elements that are chemically bonded to the tantalum element. The bonding elements include at least one ligand bonding element which is ligand-bonded to the tantalum element. Forming the metal layer includes a chemical vapor deposition (CVD) process that includes introducing a tantalum amine derivative as the tantalum precursor, introducing at least one of a $H_2$ gas, a $N_2$ gas, a compound gas including a nitrogen (N) atom, or a combination thereof, and generating plasma ions of the $H_2$ gas, the $N_2$ gas, or the combination thereof. A thin film including tantalum nitride is formed on the insulating layer including the contact hole by reacting the plasma ions with the insulating layer. In various embodiments, the thin film is post treatment processed using a gas selected from the group consisting of $H_2$, $NH_3$, $SiH_4$, $Si_2H_6$, and a combination thereof, which are activated through a remote plasma process and/or a direct plasma process.

The compound gas including a nitrogen (N) atom may include a $NH_3$ gas and/or a $N_2H_2$ gas. The $H_2$ gas, the $N_2$ gas, the compound gas including a nitrogen (N) atom, or the combination thereof may be activated through a remote plasma process and/or a direct plasma process.

In other embodiments of the present invention, a metal wiring layer is formed on the metal layer, the metal wiring layer being electrically connected with the metal layer. The metal wiring layer may include at least one layer selected from the group consisting of a poly silicon layer, a titanium (Ti) layer, a tantalum (Ta) layer, an aluminum (Al) layer, a copper (Cu) layer, a tungsten (W) layer, a rare metal layer including a rare metal, and a metal nitride layer including metal nitride. The metal layer may include ruthenium (Ru), platinum (Pt), and/or iridium (Ir). The metal nitride may include titanium nitride, tantalum nitride, and/or tungsten nitride. The metal wiring layer may include tantalum nitride.

In further embodiments of the present invention, a metal plug is formed by selectively etching the metal layer so that the metal layer only remains in the contact hole. The integrated circuit substrate may include a lower metal wiring layer underlying the metal layer that is electrically connected with the metal layer. The metal layer may include a barrier metal layer continuously formed on a side surface and a bottom surface of the contact hole and on a surface of the insulating layer. A titanium (Ti) layer, a tantalum (Ta) layer, and/or a rare metal layer including a rare metal may be formed on the integrated circuit substrate and/or the metal layer.

In other embodiments of the present invention, methods of forming a metal layer on an integrated circuit device include cleaning a substrate using a plasma gas. A first metal layer is deposited on the substrate, the first metal layer including a tantalum (Ta) layer and/or tantalum nitride (TaN) layer deposited using a sputtering process, a chemical vapor deposition (CVD) process, and/or an atomic layer deposition (ALD) process. The first metal layer is treated using the plasma gas. A second metal layer is deposited on the first metal layer. The second metal layer includes a copper (Cu) layer deposited using a sputtering process, a chemical vapor deposition (CVD) process, and/or an atomic layer deposition (ALD) process.

In further embodiments of the present invention, apparatus for forming a metal layer on an integrated circuit device include a load-lock chamber configured to load and unload a substrate. A transfer chamber connected to the load-lock chamber is configured to transfer the substrate. A cleaning chamber coupled to the transfer chamber is configured to clean the substrate using the plasma gas. A first processing chamber coupled to the transfer chamber is configured to deposit a barrier metal layer on the substrate using a sputtering process. A second processing chamber coupled to the transfer chamber is configured to deposit a barrier metal layer on the substrate using a chemical vapor deposition (CVD) process or an atomic layer deposition (ALD) process. A treating chamber coupled to the transfer chamber is configured to treat the barrier metal layer on the substrate using a plasma gas. A third processing chamber coupled to the transfer chamber is configured to deposit a copper layer on the barrier metal layer deposited on the substrate using a sputtering process. A fourth processing chamber coupled to the transfer chamber is configured to deposit a copper layer on the barrier metal layer deposited on the substrate using a CVD process and/or an ALD process. A cooling chamber coupled to the transfer chamber is configured to cool the substrate. A controller is configured to initiate transfer of the substrate to a selected chamber based on a specified process.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. It will be understood that when an element is referred to as being "on" or "connected to" or "coupled to" another element, it can be directly on, connected to or coupled to the other element or intervening layers or elements may also be present. In contrast, when an element is referred to as being "directly on" or "directly connected to" or "directly coupled to" another element, there are no intervening layers or elements present. The relative thickness of layers in the illustrations may be exaggerated for purposes of describing the present invention.

Figure 1A:
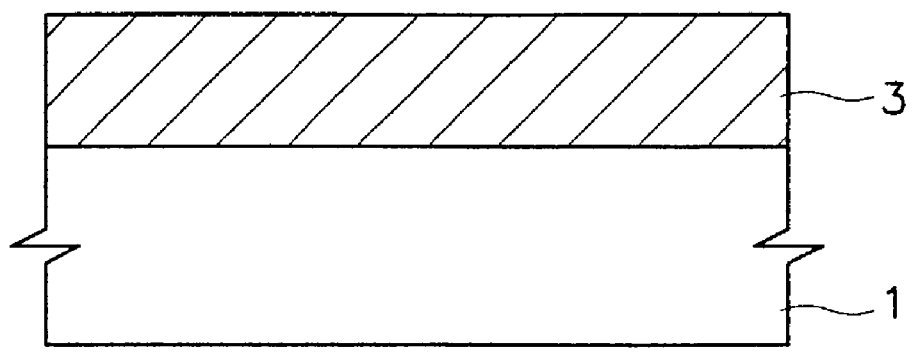
FIGS. 1A to 1C are schematic cross-sectional views illustrating methods of forming a metal layer according to some embodiments of the present invention.
Figure 1B:
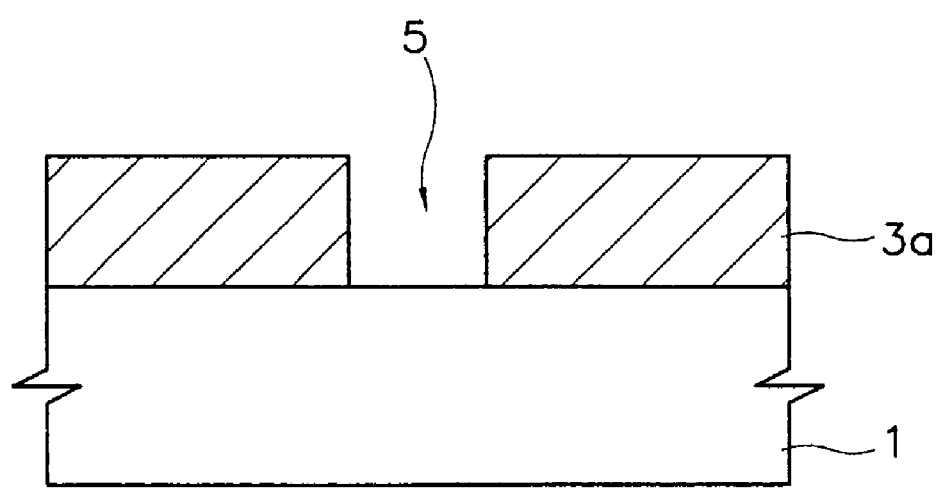
Figure 1C:
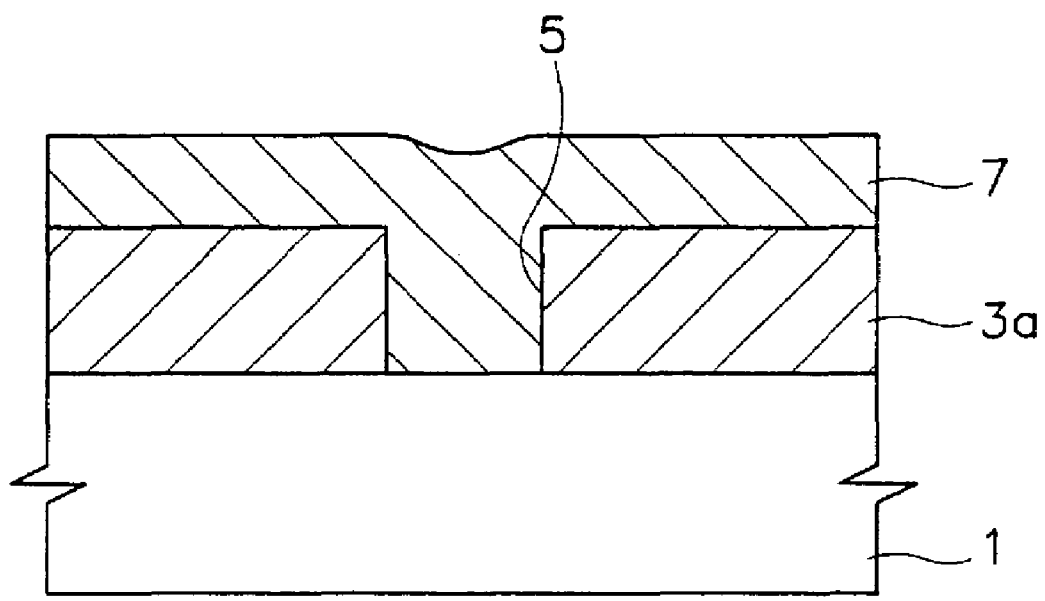

The present invention will now be further described with reference to the embodiments illustrated in the figures. FIGS. 1A to 1C are cross-sectional views illustrating methods of forming a metal layer according to some embodiments of the present invention. As shown in FIG. 1A, an insulating interlayer 3, which is to be interposed between layers, is formed on an integrated circuit (semiconductor) substrate 1. The insulating interlayer 3 may be an oxide layer including an oxide. As shown in FIG. 1B, the insulating interlayer 3 is selectively etched, for example, by a photolithography process, to partially expose the substrate 1 so as to form a contact hole 5 in the etched insulating interlayer 3a.

Referring now to FIG. 1C, a metal layer 7 is formed on the insulating layer 3a including the contact hole 5. In some embodiments of the present invention, the metal layer 7 is made of tantalum nitride, which may be continuously deposited on a surface of the insulating layer 3a and on side surfaces and the bottom surface of the contact hole 5 using a tantalum precursor. The tantalum precursor in some embodiments includes tantalum elements and bonding elements that are chemically bonded to the tantalum elements. A part of the bonding elements may include at least one ligand-bonding element, which is ligand-bonded to the tantalum element.

Examples of the tantalum precursor include a tantalum amine derivative or a tantalum halide precursor. The tantalum amine derivative may be $Ta(NR_1)(NR_2R_3)_3$ (wherein, $R_1$, $R_2$, and $R_3$ are independently selected from the group consisting of H and $C_1$–$C_6$ alkyl radicals (i.e, each be the same or different alkyl radicals)), $Ta(NR_1R_2)_5$ (wherein, $R_1$ and $R_2$ are independently selected from the group consisting of H and $C_1$–$C_6$ alkyl radicals), $Ta(NR_1R_2)x(NR_3R_4)_{5-x}$, (wherein, $R_1$, $R_2$, $R_3$ and $R_4$ are independently selected from the group consisting of H and $C_1$–$C_6$ alkyl radicals, and x is 1, 2, 3 or 4), or terbutylimido-tris-diethylamido tantalum (TBTDET:$(NEt_2)_3Ta$=NBut). The tantalum halide may be $TaF_5$, $TaCl_5$, $TaBr_5$ or $TaI_5$.

If the metal layer 7 is formed at a temperature above 650° C. using the tantalum precursor, the metal layer 7 may not be properly deposited as the tantalum precursor may be completely decomposed and particles may be generated. If the metal layer 7 is formed at a temperature less than 100° C. using the tantalum precursor, the metal layer 7 may not be properly deposited as the tantalum precursor may not be decomposed. Therefore, in some embodiments of the present invention, the metal layer 7 is deposited at a temperature range of about 100° C. to about 650° C. The metal layer 7 may also be deposited at a pressure in a range between about 0.3 Torr and about 30 Torr when the temperature is in the range of about 100° C. to about 650° C.

Figure 2A:
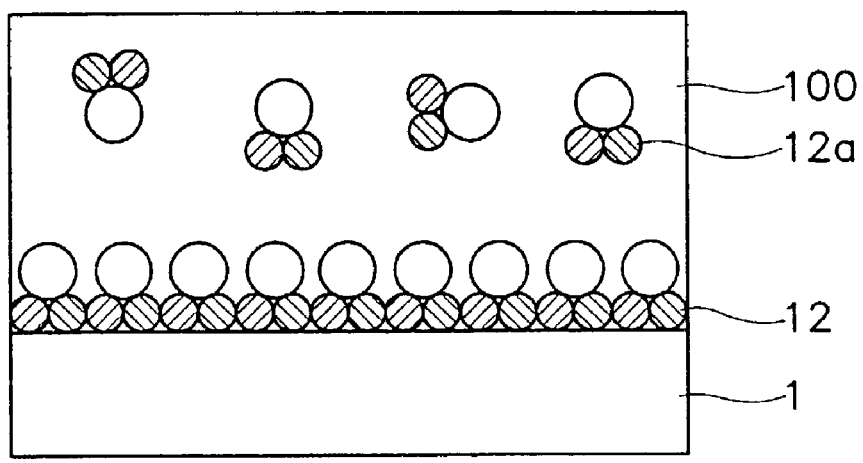
FIGS. 2A to 2D are schematic cross-sectional views illustrating methods of forming the metal layer shown in FIG. 1C using an atomic layer deposition (ALD) process according to some embodiments of the present invention.

In addition, the tantalum precursor may be introduced in a gaseous state, for example, by using a bubbler or a liquid delivery system (LDS). The tantalum precursor can be deposited on the substrate by an ALD process or a CVD process. Methods of forming the metal layer 7 using an ALD process according to embodiments of the present invention will now be described with reference to FIGS. 2A through 2D. FIGS. 2A to 2D are cross-sectional views illustrating methods of depositing an atomic metal layer. As shown in FIG. 2A, a substrate 1 including the insulating layer on which the contact hole is formed is placed in a processing chamber 100. The processing chamber 100 is maintained at a pressure in a range of about 0.3 Torr to about 30 Torr and the substrate 1 is heated to a temperature of less than about 650° C. The tantalum precursor 12a is introduced into the processing chamber 100 and at least some of the tantalum precursor 12 is chemisorbed (chemically absorbed) on the substrate 1.

Figure 2B:
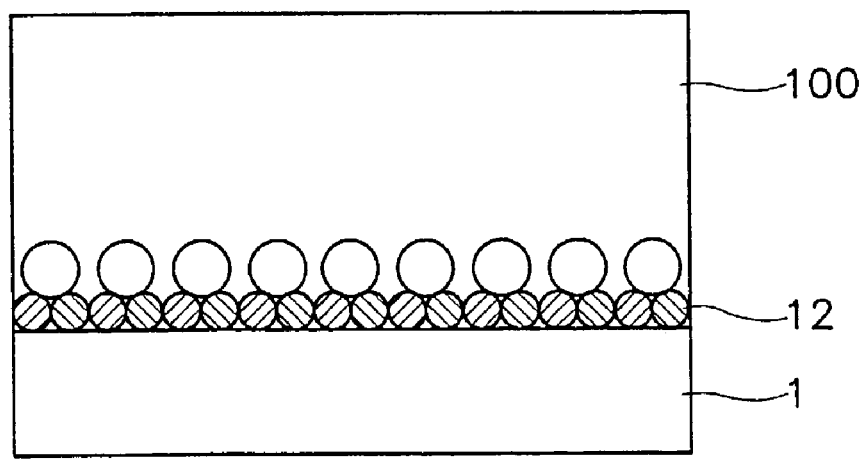

Referring to FIG. 2B, an inert gas is introduced into the processing chamber 100. As a result, non-chemisorbed tantalum precursors 12a are removed from the chamber 100. In some embodiments of the present invention, a nitrogen ($N_2$) gas or an argon (Ar) gas is used as the inert gas.

Figure 2C:
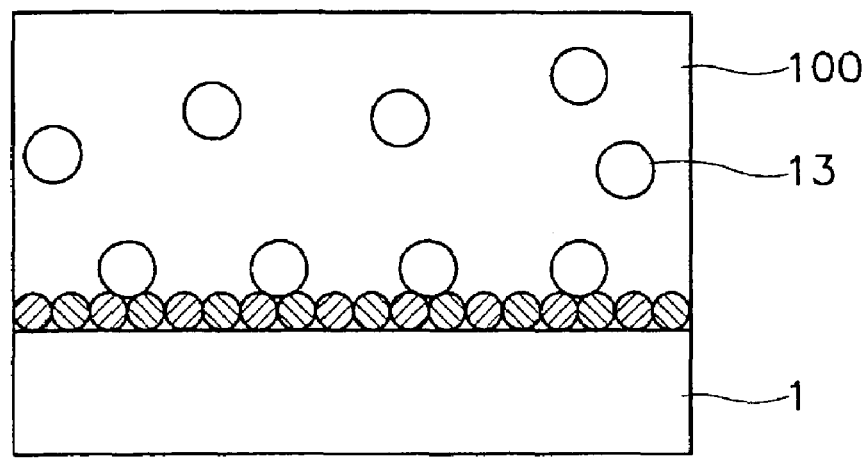

Referring to FIG. 2C, a removing gas is introduced into the processing chamber 100 and the ligand-bonded elements 13 of the chemisorbed tantalum precursors 12 are removed from the tantalum precursors 12. The ligand-bonded elements 13 are removed using a removing gas that is substantially free of hydrogen radicals, such as $H_2$, $NH_3$, $SiH_4$, or $Si_2H_6$, for example, alone or in combination. These compounds may be activated through a remote plasma process as doing so may avoid damage to the substrate.

Figure 2D:
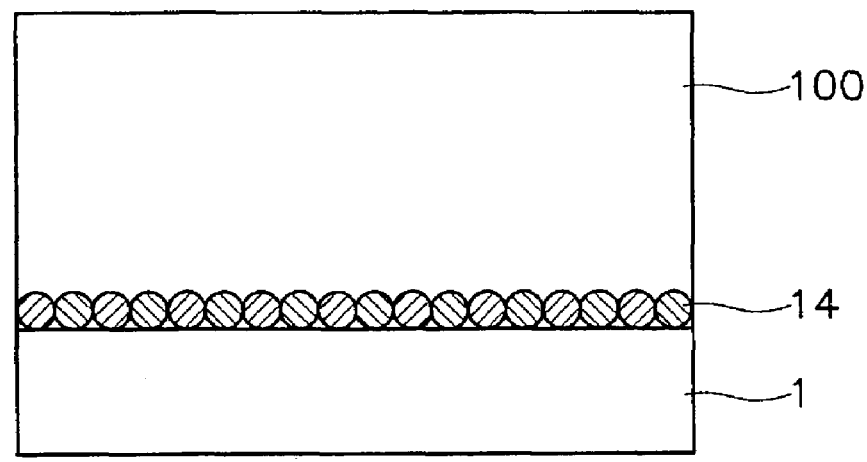

Referring to FIG. 2D, a purge gas is introduced into the processing chamber 100 and a remaining gas remaining in the processing chamber 100 is removed. As a result, as shown in FIG. 2D, an atomic layer 14 including tantalum nitride is deposited on the substrate 1. The metal layer 7 (shown in FIG. 1C) including tantalum nitride can be readily deposited on the substrate 1 by repeating the operations for deposition of the atomic layer 14 as described above. As such, the thickness of the metal layer 7 may be determined by the number of depositions of the atomic layer 14.

Furthermore, removing of the non-chemisorbed tantalum precursor from the substrate 1 by using the inert gas and removing the ligand-bonded elements from the tantalum precursor by using the removing gas can be repeated many times so as to reduce the risk of or even prevent impurities from remaining in the metal layer 7 including the tantalum nitride.

A post treatment process for the metal layer 7 can be carried out using $H_2$, $N_2$, $NH_3$, $SiH_4$, $Si_2H_6$, or combinations thereof or using $N_2$, $NH_3$, $SiH_4$, $Si_2H_6$, or combinations thereof, which may be activated through a remote plasma process and/or a direct plasma process, after forming the metal layer 7. The post treatment may be provided in order to substantially or completely remove the impurities remaining in the metal layer 7. While the remote plasma process generally generates a radio frequency plasma gas outside of the processing chamber 100 and provides the plasma gas for introduction into the processing chamber 100, a direct plasma process generates the radio frequency plasma gas inside the processing chamber 100.

Figure 3:
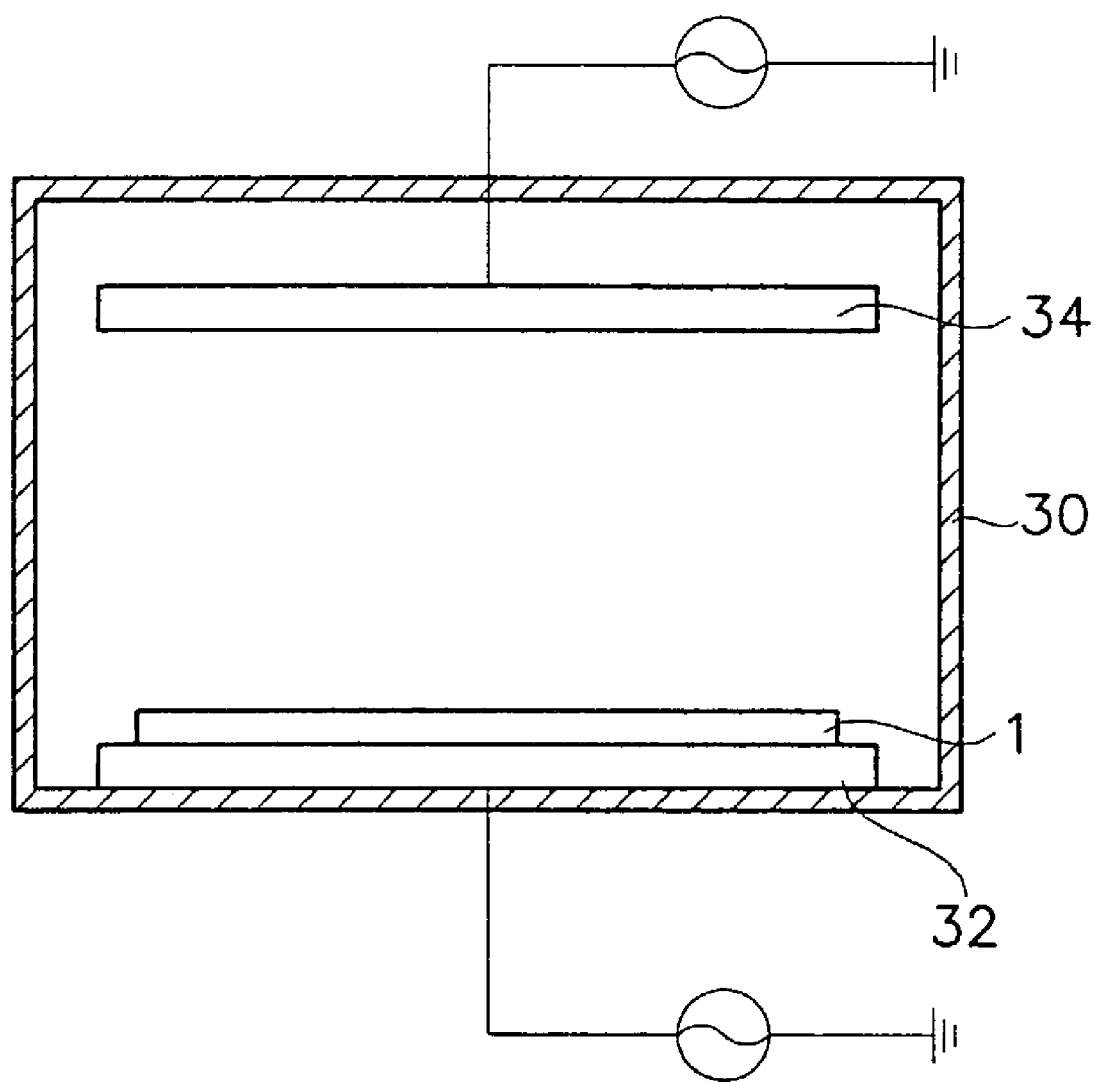
FIG. 3 is a schematic cross-sectional side view illustrating an apparatus for forming the metal layer shown in FIG. 1C using a chemical vapor deposition (CVD) process according to some embodiments of the present invention.

A method of forming the metal layer 7 using the direct plasma type CVD process according to other embodiments of the present invention will now be described with reference to FIG. 3. FIG. 3 illustrates an apparatus for forming the metal layer shown in FIG. 1C using a CVD process. As shown in FIG. 3, a substrate 1 including the insulating layer on which the contact hole is formed is placed in a processing chamber 30 including electrodes 32, 34. The processing chamber 30 is maintained at a pressure in a range of about 0.3 Torr to about 30 Torr and the substrate 1 is heated to a temperature of less than about 650° C. The tantalum amine derivatives are introduced into the processing chamber 30 along with gaseous reactants. A hydrogen ($H_2$) gas, a nitrogen ($N_2$) gas or a compound gas including nitrogen (N) atom can be used as the gaseous reactants, alone or in combination. These gaseous reactants can be used as activated. An $NH_3$ gas or an $N_2H_2$ gas can be used as the compound gas including nitrogen (N) atom.

For the embodiments described with reference to FIG. 3, the tantalum amine derivatives and the reactants are activated through the direct plasma process and are reacted with each other on the substrate to form the metal layer 7 including the tantalum nitride. It is to be understood that the tantalum amine derivatives and the reactants may be activated through the remote plasma process.

A post treatment process for the metal layer 7 can also be carried out by using $H_2$, $N_2$, $NH_3$, $SiH_4$, $Si_2H_6$, or combinations thereof, which may be activated through the remote plasma process and/or the direct plasma process, after forming the metal layer 7, in order to substantially or completely remove the impurities remaining in the metal layer 7.

Thus, the metal layer 7 including tantalum nitride can be formed through the ALD or the CVD process using the tantalum precursor. For particular embodiments of the present invention, the metal layer 7 can be deposited at a relatively low temperature. Furthermore, process parameter variables caused by plasma generation can be removed by activating the removing gases through the remote plasma process. That is, the metal layer 7 in some embodiments may be provided with good step-coverage and fewer process parameter variables at a low temperature.

As described above, the metal layer 7 may be formed as a result of chemical reactions. A chemical reaction for removing the tantalum precursor by using the inert gas is referred to herein as a purification reaction, and the chemical reaction for removing the ligand-bonded element by using the removing gas is referred to as a removing reaction. During the removing reaction, the removing gas is reacted with the ligand-bonded element so that the ligand-bonded element is removed from the tantalum precursor as the reactivity of the removing gas with the ligand-bonded element is selected to be higher than that of the ligand-bonded element to the tantalum precursor. When terbutylimido-tris-diethylamido-tantalum (($NEt_2)_3$Ta=Nbut, hereinafter simply referred to as "TBTDET") is used as the tantalum precursor, the reaction mechanism for depositing the metal layer is as will now be described.

First, a part of the TBTDET is chemisorbed onto the substrate and the non-chemisorbed TBTDET is removed from the substrate during the purification reaction. Then, the ligand-bonded elements are removed through the removal reaction by using the reactivity difference between the ligand-bonded elements and the removal gas to the tantalum precursor. During the removal reaction, the TBTDET is generally not influenced by the removing gas as the TBTDET includes a double bond of Ta=N. Accordingly, generally only the ligand-bonded elements are removed during the removal reaction so that an atomic layer comprising TaN can be deposited on the substrate.

For the reaction mechanism described in the Kang at el. article, the ligand-bonded elements are removed by substitution reaction using hydrogen radicals as a reducing agent. In addition, a power source is applied into the processing chamber when the tantalum nitride is deposited.

In various CVD processes according to embodiments of the present invention, tantalum amine derivatives are used as tantalum precursors. Conventional CVD processes generally use tantalum halide as tantalum precursors.

Figure 4A:
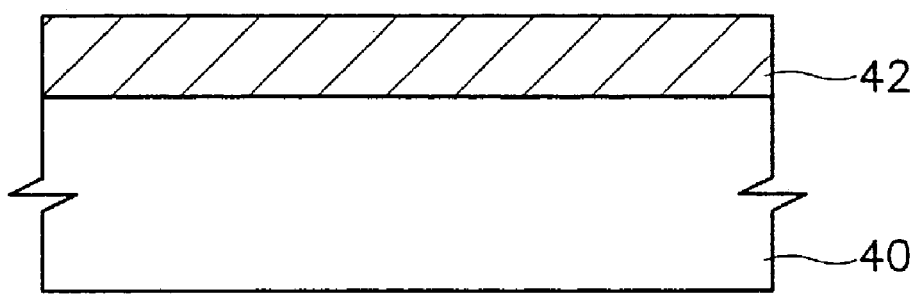
FIGS. 4A to 4F are schematic cross-sectional views illustrating methods of forming a metal layer according to further embodiments of the present invention.

Operations related to forming a metal layer for some embodiments of the present invention will now be further described with reference to FIGS. 4A–4F. As shown in FIG. 4A, a first metal layer 42 is deposited on the substrate 40. Examples of the first metal layer 42 include a polysilicon layer, a titanium (Ti) layer, a tantalum (Ta) layer, an aluminum (Al) layer, a copper (Cu) layer, a tungsten (W) layer, a rare metal layer having rare metal, a metal nitride layer having metal nitride, a combination thereof and the like. The first metal layer may be a single layer or a composite layer having two or more stacked layers. Preferably, the first metal layer is a single layer. The metal layer may include ruthenium (Ru), platinum (Pt), or iridium (Ir), and the metal nitride may include titanium nitride, tantalum nitride, or tungsten nitride. The substrate 40 may be cleaned by using plasma gases before the first metal layer 42 is formed.

Figure 4B:
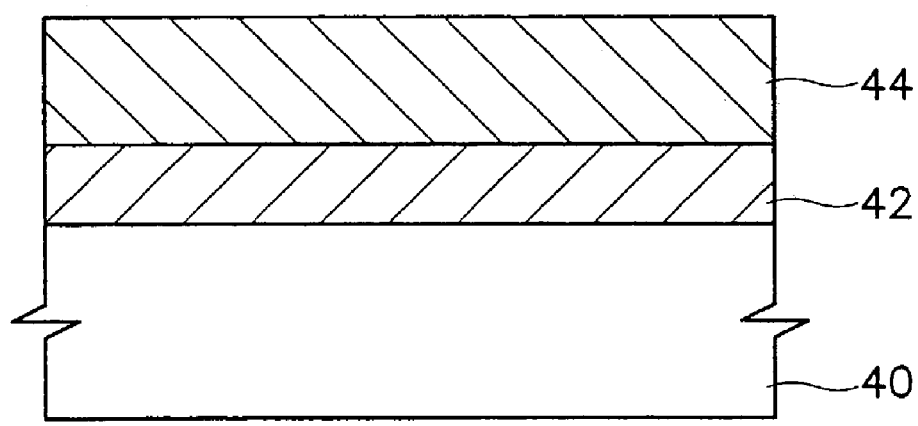
Figure 4C:
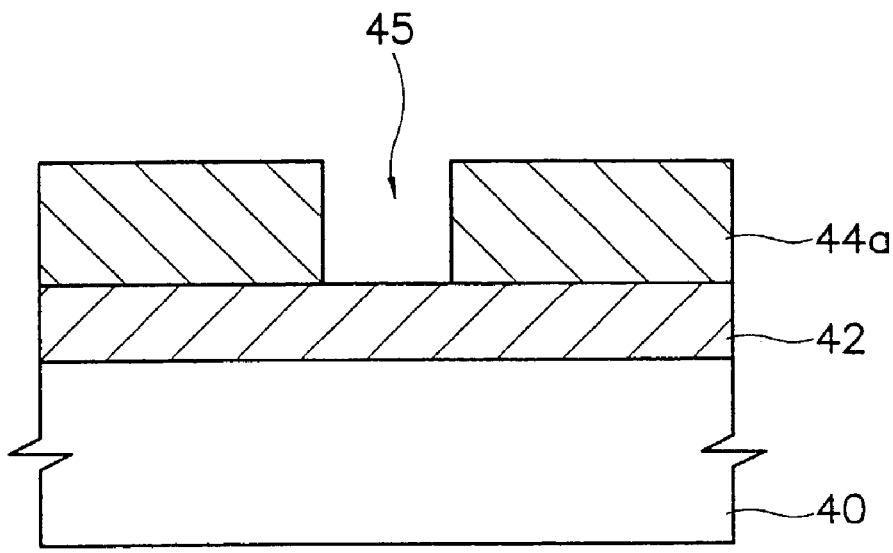

As shown in FIG. 4B, an insulating interlayer 44, which is to be interposed between two layers, is formed on the first metal layer 42. In some embodiments of the present invention, the insulating interlayer 44 is an oxide layer including an oxidized material. Referring to FIG. 4C, the insulating interlayer 44 is selectively etched through a photolithography process, so that the first metal layer 42 is partially exposed to thereby form a contact hole 45 in the etched insulating layer 44a. The etched insulating layer 44a including the contact hole 45 may be cleaned by plasma gases.

Figure 4D:
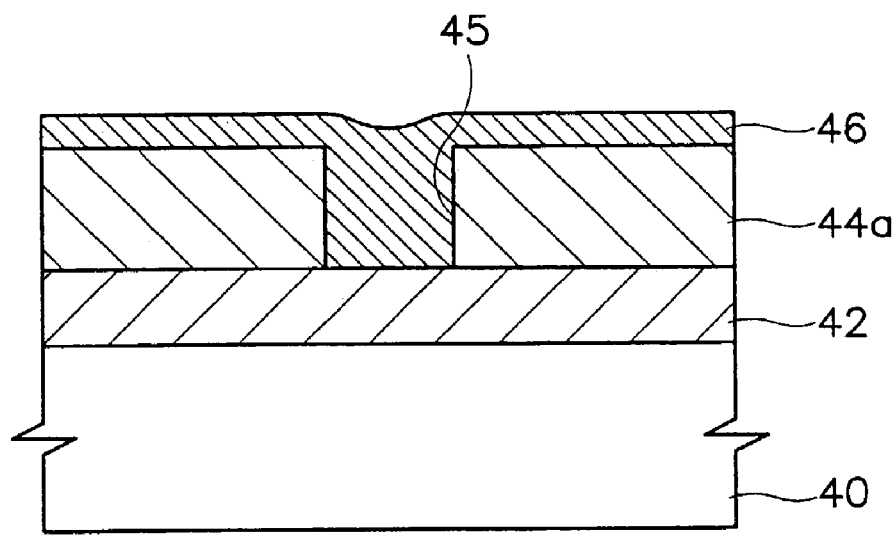

Referring to FIG. 4D, the second metal layer 46 may be continuously formed on a surface of the insulating layer 44a, and a side surface and a bottom surface of the contact hole 45. The second metal layer 46 may be formed through the ALD or the CVD process according to various embodiments of the present invention. The second metal layer 46 illustrated in FIG. 4D includes tantalum nitride.

Figure 4E:
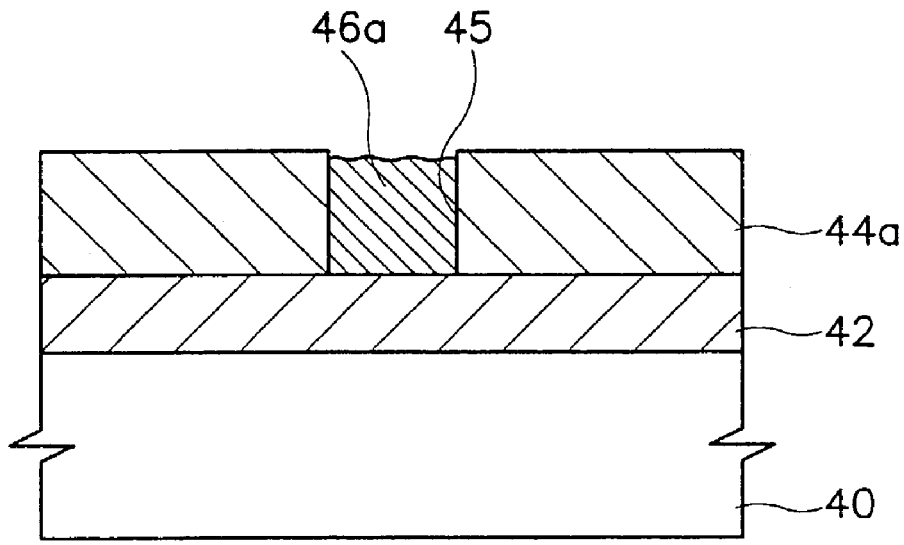

As shown in FIG. 4E, the surface of the insulating layer 44a is exposed by removing the second metal layer 46 through, for example, a polishing process or an etch-back process. As a result, a metal plug 46a is formed in the contact hole 45. The metal plug 46a can be cleaned using plasma gases.

Figure 4F:
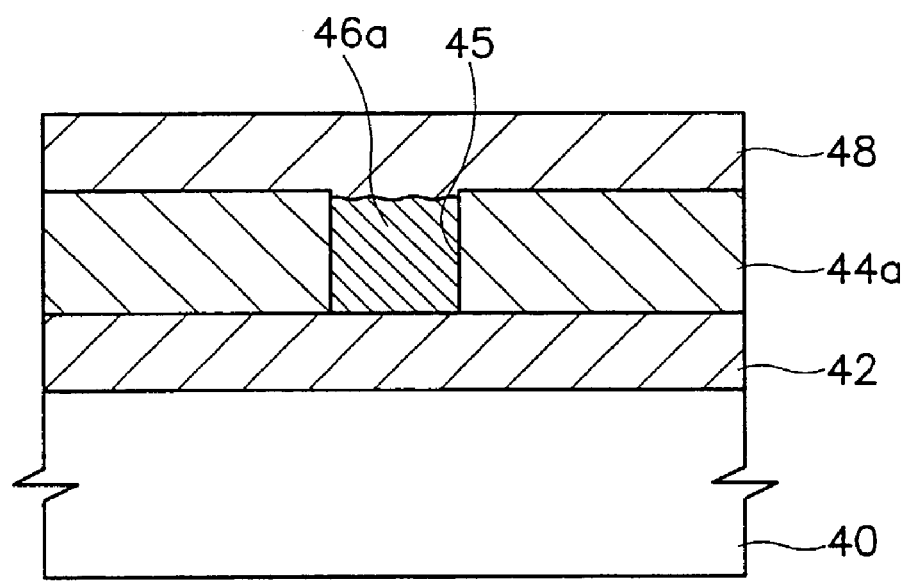

As shown in FIG. 4F, a third metal layer 48 may be continuously formed on the surface of the insulating layer 44a and the metal plug 46a. The third metal layer 48 may be, for example, a polysilicon layer, a titanium (Ti) layer, a tantalum (Ta) layer, an aluminum (Al) layer, a copper (Cu) layer, a tungsten (W) layer, a rare metal layer having rare metal, a metal nitride layer having metal nitride, and/or a combination thereof. The rare metal may include ruthenium (Ru), platinum (Pt), or iridium (Ir). The metal nitride may include titanium nitride, tantalum nitride and/or tungsten nitride. The third metal layer 48 can be formed through the ALD or the CVD process according to various embodiments of the present invention. Thus, for some embodiments of the present invention, a metal wiring including the first metal layer 42, the metal plug 46a having tantalum nitride, and the third metal layer 48 can be formed on the substrate 40.

Figure 5A:
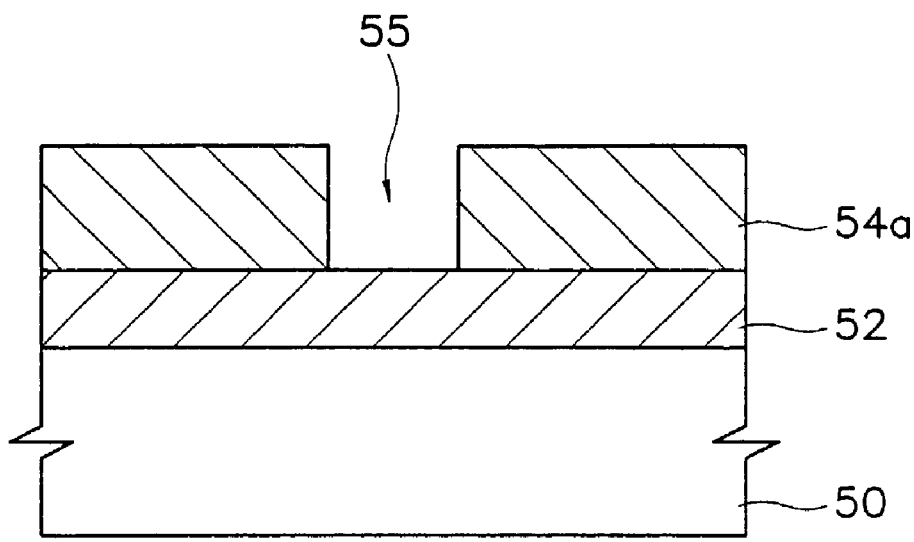
FIGS. 5A to 5B are schematic cross-sectional views illustrating methods of forming a metal layer according to other embodiments of the present invention.
Figure 5B:
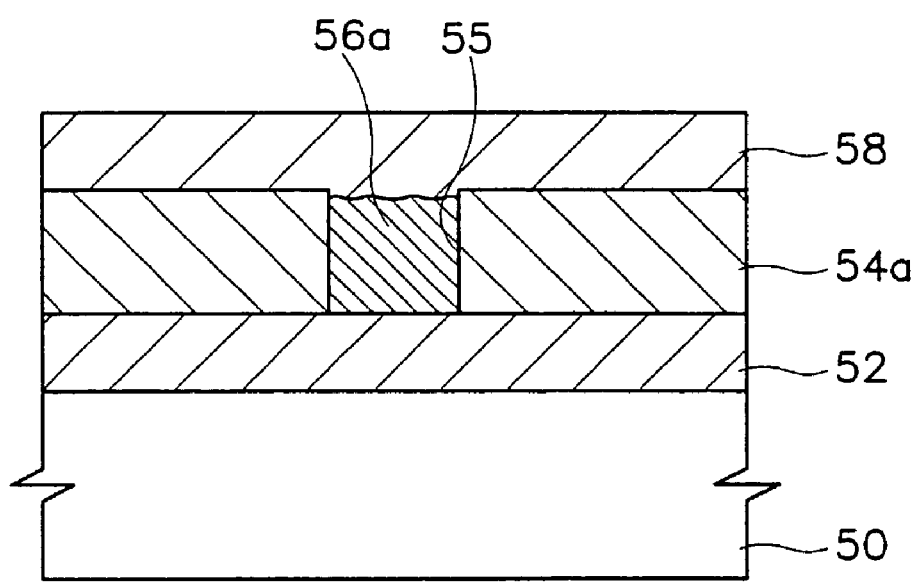

Further embodiments of the present invention will now be described with reference to FIGS. 5A–5B. As shown in FIG. 5A, a first metal layer 52 and an insulating layer 54a including a contact hole 55 are formed on a substrate 50, for example, as described with reference to FIGS. 4A–4C. As shown in FIG. 5B, a second metal layer may be continuously deposited on a surface of the insulating layer 54a, and a side and a bottom surface of the contact hole 55. The second metal layer may be a polysilicon layer, a titanium (Ti) layer, a tantalum (Ta) layer, an aluminum (Al) layer, a copper (Cu) layer, a tungsten (W) layer, a rare metal layer having rare metal, a metal nitride layer having metal nitride, and/or a combination thereof. The rare metal may include ruthenium (Ru), platinum (Pt), or iridium (Ir). The metal nitride may include titanium nitride, tantalum nitride, or tungsten nitride. The second metal layer is formed through the ALD or the CVD process according to some embodiments of the present invention. The substrate 50 may be cleaned using plasma gases before the second metal layer is formed.

The surface of the insulating layer 54a is exposed by removing the second metal layer, for example, through a polishing process or an etch-back process, to form a metal plug 56a in the contact hole 55. Subsequently, a third metal layer 58 is formed on the surface of the insulating layer 54a and the metal plug 56a. The third metal layer 58 is formed through the ALD or the CVD process according to some embodiments of the present invention and includes tantalum nitride. The third metal layer 58 can be cleaned using plasma gases. A metal wiring including the first metal layer 52, the metal plug 56a, and the third metal layer 58 having tantalum nitride can, thereby, be formed on the substrate 50.

Figure 6A:
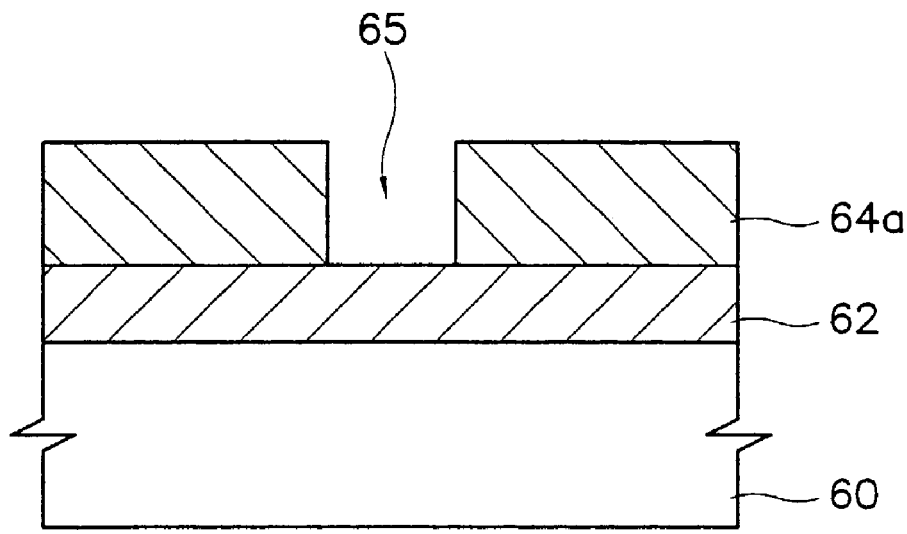
FIGS. 6A to 6C are schematic cross-sectional views illustrating methods of forming a metal layer according to further embodiments of the present invention.
Figure 6B:
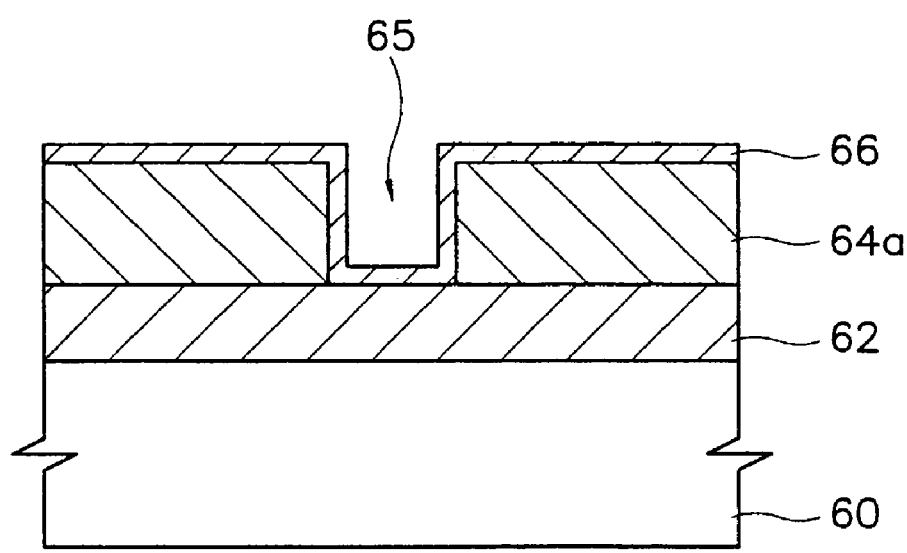

Further embodiments of the present invention will now be described with reference to FIGS. 6A–6C. As shown in FIG. 6A, a first metal layer 62 and an insulating layer 64a including a contact hole 65 are formed on a substrate 60, for example, as described with reference to FIGS. 4A–4C. As shown in FIG. 6B, a barrier metal layer 66 may be continuously deposited on a surface of the insulating layer 64a, and a side and a bottom surface of the contact hole 65. The barrier metal layer 66 is formed through the ALD or the CVD process for some embodiments of the present invention and includes tantalum nitride. The substrate 60 may be cleaned using plasma gases before the barrier metal layer is formed.

Figure 6C:
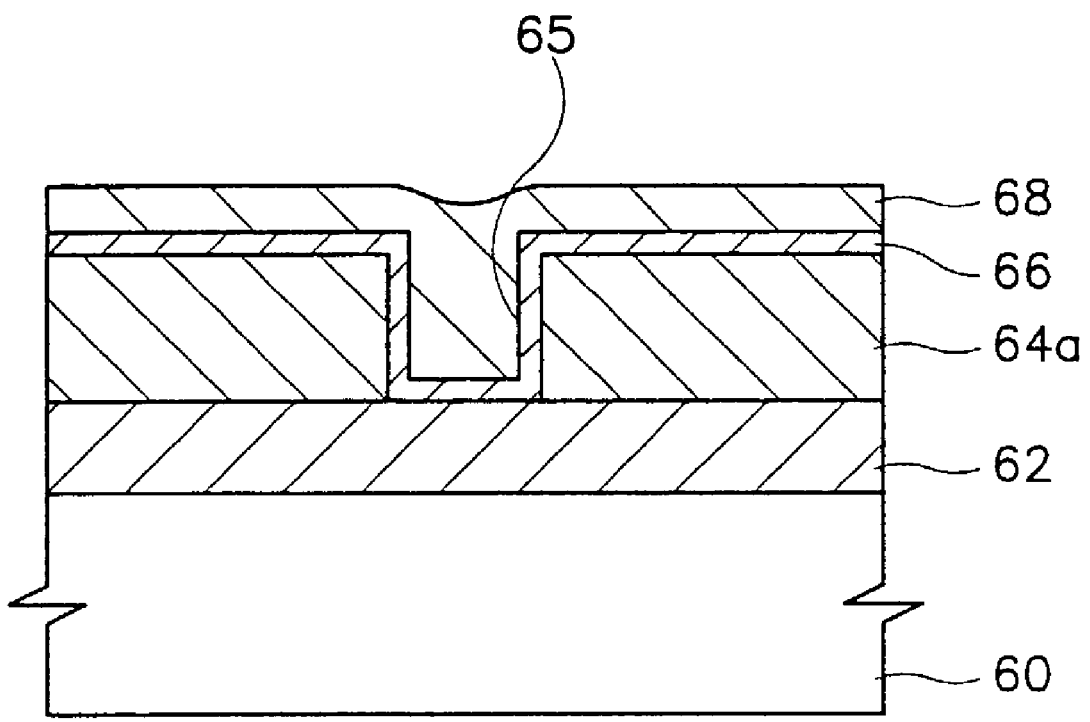

As shown in FIG. 6C, a second metal layer 68 is formed on the barrier metal layer 66. The second metal layer 68 may be, for example, a polysilicon layer, a titanium (Ti) layer, a tantalum (Ta) layer, an aluminum (Al) layer, a copper (Cu) layer, a tungsten (W) layer, a rare metal layer having rare metal, a metal nitride layer having metal nitride, and/or a combination thereof. The rare metal may include ruthenium (Ru), platinum (Pt) and/or iridium (Ir). The metal nitride may include titanium nitride, tantalum nitride and/or tungsten nitride. The second metal layer 68 is formed through the ALD or the CVD process for some embodiments of the present invention. The substrate 60 may be cleaned using plasma gases.

A metal wiring including the first metal layer 62, the barrier metal layer 66 having tantalum nitride, and the second metal layer 68 can, thereby, be formed on the substrate 60. The barrier metal layer 66 having tantalum nitride may reduce the likelihood of or prevent the second metal layer 68 from being reacted with silicon or silicon oxide. Furthermore, a variety of types of metal layers, which are deposited using the ALD or CVD process according to embodiments of the present invention and include tantalum nitride, can be used as multi-layer metal wirings.

Figure 7:
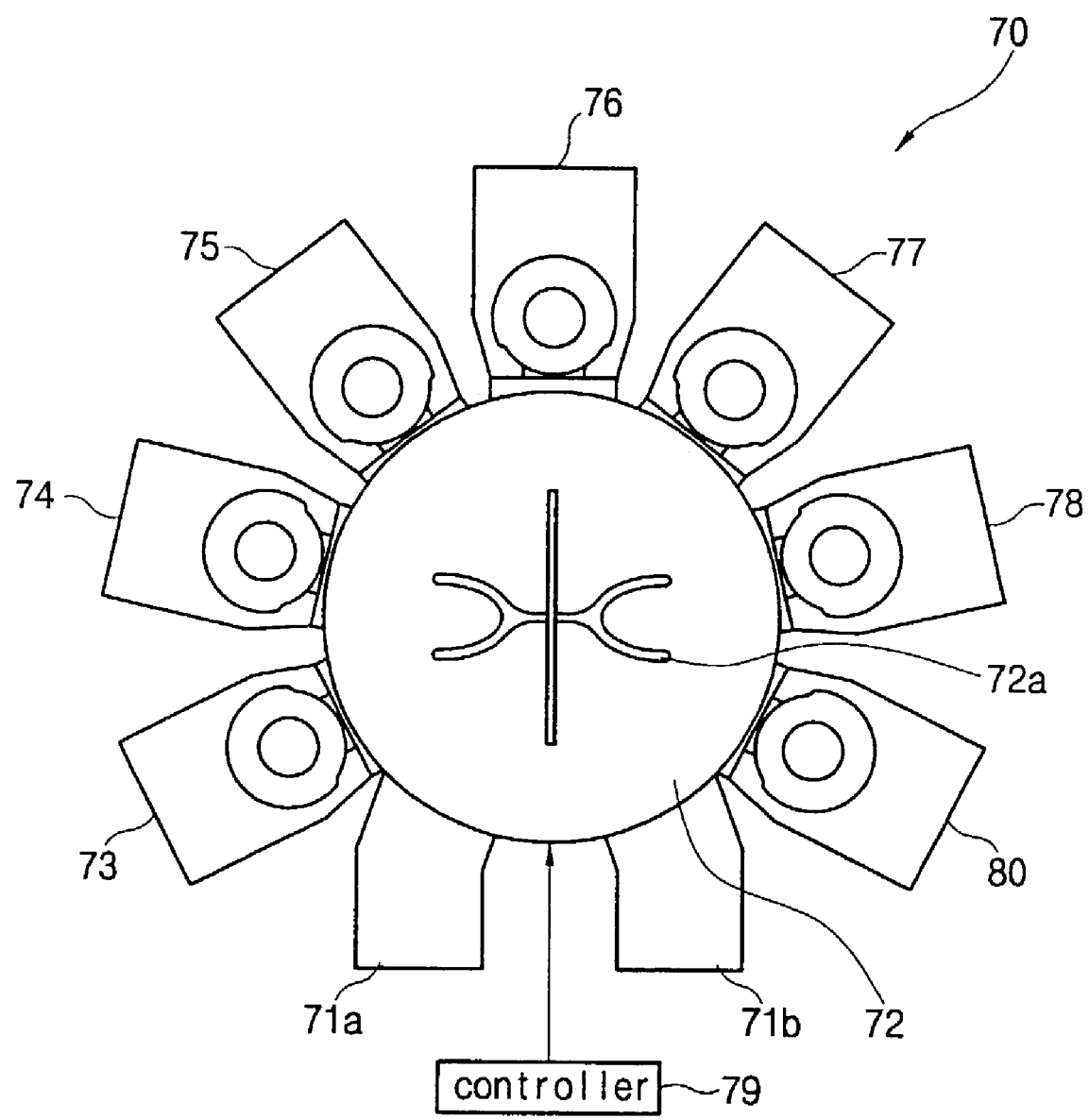
FIG. 7 is a schematic top view illustrating an apparatus for forming a metal layer according to some embodiments of the present invention.

FIG. 7 is a schematic view illustrating an apparatus for forming the metal layer including tantalum nitride according to some embodiments of the present invention. As shown schematically in FIG. 7, an apparatus 70 for forming the metal layer includes a first load-lock chamber 71a configured to load a substrate into the apparatus 70, a second load-lock chamber 71b configured to unload the substrate from the apparatus 70, and a transfer chamber 72 connected to the first and second load-lock chamber 71a and 71b configured to transfer the substrate. A transfer member 72a, for example a robot arm, can be installed into the transfer chamber 72 to transfer the substrate in the apparatus 70. The illustrated apparatus 70 also includes a cleaning chamber 73, first and second processing chambers 74 and 75 configured to deposit a barrier metal layer, a treating chamber 76, third and fourth processing chambers 77 and 78 configured to deposit a metal layer, and a cooling chamber 80.

The substrate may be cleaned in the cleaning chamber 73 using plasma gases as will be understood by those of skill in the art. A barrier metal layer may be deposited in the first processing chamber 74 through a sputtering process. The barrier metal layer may be a tantalum (Ta) layer and/or a tantalum nitride (TaN) layer in the first processing chamber 74. A barrier metal layer may also be deposited in the second processing chamber 75 through a CVD or ALD process. For example, a tantalum nitride (TaN) layer may be deposited in the second processing chamber 75 and the barrier metal layer may be treated with plasma gases in the treating chamber 76. A metal layer may be deposited in the third chamber 77 through a sputtering process and may also be deposited in the fourth processing chamber 78 through a CVD or ALD process. For example, a copper (Cu) layer can be deposited as the metal layer.

As illustrated in FIG. 7, the apparatus 70 may be formed to have a cluster structure so that the transfer chamber 72 is surrounded by and operatively coupled to the first and second load-lock chamber 71a and 71b, the cleaning chamber 73, the first and second processing chambers 74 and 75, the treating chamber 76, and the third and fourth processing chambers 77 and 78. This arrangement may facilitate use of the transfer chamber 72 to carry out all substrate transfer operations inside the apparatus 70. In addition, the apparatus 70 includes a cooling chamber 80 so that the substrate can be cooled down during processing inside the apparatus 70.

In addition, the apparatus 70 includes a controller 79 for initiating and controlling transferring of the substrate to a chamber specified by a selected process. For example, when the selected (predetermined) process corresponds to that described with reference to FIGS. 6A–6C, the controller 79 controls the substrate transfers as the substrate need only be transferred to the cleaning chamber 73, the second processing chamber 75, the treating chamber 76, and the fourth processing chamber 78.

The apparatus 70 can form a predetermined metal layer as an in-situ layer. The sputtering or ALD process may be particulary suitable for forming the in-situ metal layer.

Characteristics of a metal layer formed according to an embodiment of the present invention will now be described.

Step-Coverage

A tantalum nitride was deposited on the insulating layer including a contact hole having an aspect ratio of 9:1 in the same manner as described with reference to FIGS. 4A–4F. A measurement of step-coverage of the formed tantalum nitride (TaN) layer showed that the step coverage at the contact hole was substantially 100%. Thus, good step-coverage was provided for this example.

Via Contact Resistance

Test specimens for testing the via contact resistance were prepared as follows. First, an aluminum (Al) layer was deposited on the substrate as a lower metal layer and a capping layer was deposited on the lower metal layer. Subsequently, the lower metal layer was partially etched out, and an insulating layer was deposited on the partially etched lower metal layer. The insulating layer was partially etched out to thereby form a contact hole having a diameter of 0.23 mm. A barrier metal layer was continuously deposited on the insulating layer including the contact hole. An aluminum (Al) layer was deposited on the barrier metal layer as an upper metal layer. The upper metal layer was re-flowed at a high temperature. The barrier metal layer differed for different specimens discussed below.

Figure 8:
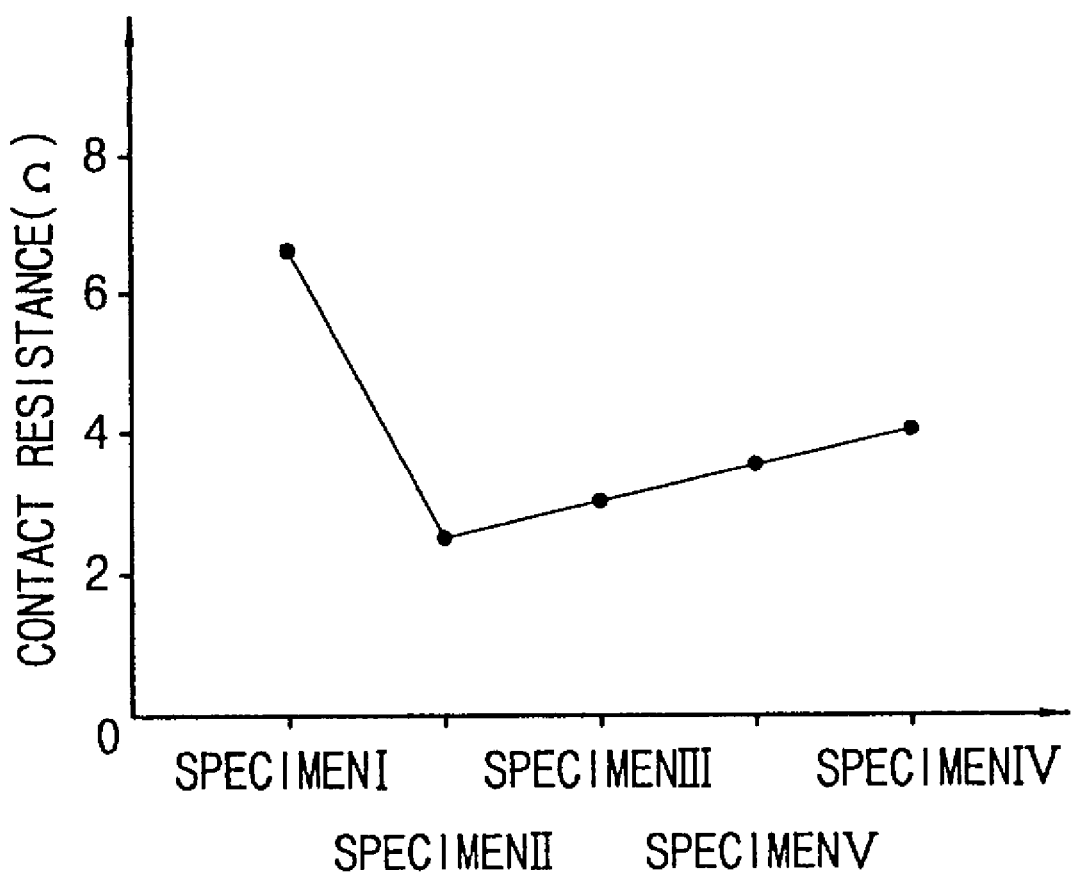
FIG. 8 is a graph illustrating contact resistance of the metal layer formed by an embodiment of the present invention.

FIG. 8 is a graph showing the contact resistance of the metal layer of the test specimans. In FIG. 8, the barrier metal layer of the specimen I is a tantalum nitride (TaN) layer deposited by the ALD process according to an embodiment of the present invention. The barrier metal layer of the specimen II is a tantalum nitride (TaN) layer of 100 Å thickness deposited by the CVD process according to an embodiment of the present invention. The barrier metal layer of the specimen III is a tantalum nitride (TaN) layer of 200 Å thickness deposited by the CVD process according to an embodiment of the present invention. The barrier metal layer of the specimen IV is a tantalum nitride (TaN) layer of 300 Å thickness deposited by the CVD process according to an embodiment of the present invention. The barrier metal layer of the specimen V is a tantalum nitride (TaN) layer deposited by a conventional sputtering process.

As shown in FIG. 8, the via contact resistance test shows that the resistance was 7.0Ω for specimen I, 3.5Ω for specimen II, 3.7Ω for specimen III, 4.0Ω for specimen IV, and 4.3Ω for specimen V. Thus, these test results indicate that the resistance of specimens II, III, and IV were improved over that of specimen V, which was formed by a conventional sputtering process. Therefore, the via contact resistance of the metal layer may be improved by carrying out a CVD process according to embodiments of the present invention. The via contact resistance of specimen I is a bit higher than that of specimen V. However, the resistance of the specimen I would not be expected to be problematic when used in an integrated circuit (semiconductor) device. Therefore, the via contact resistance of the metal layer can also be improved using an ALD process according to some embodiments of the present invention.

According to some embodiments of the present invention, a metal layer including tantalum nitride layer may be easily deposited on a substrate at a relatively low temperature. The metal layer can have a good step-coverage and the process may require control of fewer process parameters, which may improve the reliability of a resulting integrated circuit (semiconductor) device.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a metal layer on an integrated circuit device, comprising the steps of:
    forming an insulating layer on an integrated circuit substrate;
    forming a contact hole by selectively etching the insulating layer to thereby partially expose the substrate; and
    forming a metal layer including tantalum nitride on the insulating layer including the contact hole using a tantalum precursor including a tantalum element and at least one bonding element that is chemically bonded to the tantalum element, wherein a part of the at least one bonding element includes at least one ligand bonding element which is ligand-bonded to the tantalum element and wherein forming the metal layer includes removing at least some of the ligand bonded elements with a removing gas that is substantially free of hydrogen radicals and nitrogen.

2. The method of claim 1 wherein the removing gas is activated through a remote plasma process and wherein forming the metal layer comprises forming the metal layer using an atomic layer deposition (ALD) process.

3. The method of claim 1 wherein the tantalum precursor includes a tantalum amine derivative.

4. The method of claim 3 wherein the tantalum precursor includes a tantalum amine derivative that includes $Ta(NR_1)(NR_2R_3)_3$, $Ta(NR_1R_2)_5$, $Ta(NR_1R_2)_x(NR_3R_4)_{5-x}$ and/or ter-butylimido-tris-diethylamido tantalum (TBTDET:$(NEt_2)_3$Ta=NBut), wherein, $R_1, R_2, R_3$ and $R_4$ are independently selected from the group consisting of H and $C_1$–$C_6$ alkyl radicals, and x is 1, 2, 3 or 4.

5. The method of claim 1 wherein the tantalum precursor is introduced in a gaseous state.

6. The method of claim 1 wherein the metal layer is formed at a temperature in a range from about 100° C. to about 650° C. and at a pressure in a range from about 0.3 Torr to about 30 Torr.

7. The method of claim 1 wherein forming the metal layer comprises:
    a) introducing the tantalum precursor;
    b) chemisorbing at least part of the tantalum precursor on the insulating layer including the contact hole;
    c) removing a non-chemisorbed tantalum precursor that has not been chemisorbed to the insulating layer;
    d) removing the ligand bonding element of the bonding elements of the chemisorbed tantalum precursor from the chemisorbed tantalum precursor using the removing gas;

e) removing a residual material around the integrated circuit substrate during the step of removing the ligand bonding element; and f) forming a thin film including tantalum nitride on the insulating layer including the contact hole by repeating steps a) through e) at least once.

8. The method of claim 7 wherein removing a non-chemisorbed tantalum precursor comprises removing the non-chemisorbed tantalum precursor using an inert gas.

9. The method of claim 8 wherein the removing gas is selected from the group consisting of $H_2$, $SiH_4$, $Si_2H_6$ and combinations thereof.

10. The method of claim 7 wherein the removing gas is selected from the group consisting of $SiH_4$, $Si_2H_6$ and combinations thereof.

11. The method of claim 7 wherein the ligand bonding element is removed by using any one gas selected from the group consisting of $H_2$, $SiH_4$, $Si_2H_6$, and a combination thereof, which are activated through a remote plasma process.

12. The method of claim 7 wherein step f) is preceded by repeating steps c) to e) at least once.

13. The method of claim 7 wherein step f) is followed by a post treatment process for the thin film using a gas selected from the group consisting of $H_2$, $NH_3$, $SiH_4$, $Si_2H_6$, and combinations thereof, activated through a remote plasma process and/or a direct plasma process.

14. A method of forming a metal layer on an integrated circuit device, comprising the steps of:

forming an insulating layer on an integrated circuit substrate;

forming a contact hole by selectively etching the insulating layer to thereby partially expose the substrate; and forming a metal layer including tantalum nitride on the insulating layer and filling the contact hole using a tantalum precursor including a tantalum element and at least one bonding element that is chemically bonded to the tantalum element, wherein a part of the at least one bonding element includes at least one ligand bonding element which is ligand-bonded to the tantalum element, wherein forming the metal layer comprises a chemical vapor deposition (CVD) process including:

a) introducing a tantalum amine derivative as the tantalum precursor;

b) introducing at least one of a $H_2$ gas, a $N_2$ gas, a compound gas including a nitrogen (N) atom, or a combination thereof, c) generating plasma ions of the $H_2$ gas, the $N_2$ gas, or the combination thereof; and d) forming a thin film including tantalum nitride on the insulating layer including the contact hole by reacting the plasma ions with the insulating layer.

15. The method of claim 14 wherein step d) is followed by post treatment processing the thin film using a gas selected from the group consisting of $H_2$, $NH_3$, $SiH_4$, $Si_2H_6$, and a combination thereof, which are activated through a remote plasma process and/or a direct plasma process.

16. The method of claim 14 wherein the compound gas including a nitrogen (N) atom includes a $NH_3$ gas and/or a $N_2H_2$ gas.

17. The method of claim 14 wherein the $H_2$ gas, the $N_2$ gas, the compound gas including a nitrogen (N) atom, or the combination thereof are activated through a remote plasma process and/or a direct plasma process.

18. The method of claim 1, further comprising the step of forming a metal wiring layer on the metal layer, the metal wiring layer being electrically connected with the metal layer.

19. The method of claim 18 wherein the metal wiring layer includes at least one layer selected from the group consisting of a poly silicon layer, a titanium (Ti) layer, a tantalum (Ta) layer, an aluminum (Al) layer, a copper (Cu) layer, a tungsten (W) layer, a rare metal layer including a rare metal, and a metal nitride layer including a metal nitride.

20. The method of claim 19 wherein the rare metal comprises ruthenium (Ru), platinum (Pt), and/or iridium (Ir).

21. The method of claim 18 wherein the metal nitride comprises titanium nitride, tantalum nitride, and/or tungsten nitride.

22. The method of claim 18 wherein the metal wiring layer includes tantalum nitride.

23. The method of claim 1, further comprising forming a metal plug by selectively etching the metal layer so that the metal layer only remains in the contact hole.

24. The method of claim 1 wherein the integrated circuit substrate includes a lower metal wiring layer underlying the metal layer that is electrically connected with the metal layer.

25. The method of claim 1 wherein the metal layer includes a barrier metal layer continuously formed on a side surface and a bottom surface of the contact hole and on a surface of the insulating layer.

26. The method of claim 1, further comprising forming a titanium (Ti) layer, a tantalum (Ta) layer, and/or a rare metal layer including a rare metal on the integrated circuit substrate.

27. The method of claim 1, further comprising forming a titanium (Ti) layer, a tantalum (Ta) layer, and/or a rare metal layer including a rare metal on the metal layer.

* * * * *

UNITED STATES PATENT AND TRADEMARK OFFICE
CERTIFICATE OF CORRECTION

| | | |
|---|---|---|
| PATENT NO. | : 7,067,420 B2 | Page 1 of 1 |
| APPLICATION NO. | : 10/404360 | |
| DATED | : June 27, 2006 | |
| INVENTOR(S) | : Choi et al. | |

It is certified that error appears in the above-identified patent and that said Letters Patent is hereby corrected as shown below:

<u>Column 13,</u>
Line 10 should read -- 9. The method of claim 7 wherein the removing gas is --

Signed and Sealed this

Twenty-first Day of November, 2006

JON W. DUDAS
*Director of the United States Patent and Trademark Office*